(12) United States Patent
Karim et al.

(10) Patent No.: US 11,450,380 B2
(45) Date of Patent: Sep. 20, 2022

(54) APPARATUSES, SYSTEMS, AND METHODS FOR FREQUENCY-DEPENDENT SIGNAL MODULATION

(71) Applicant: MICRON TECHNOLOGY, INC., Boise, ID (US)

(72) Inventors: M. Ataul Karim, Boise, ID (US); Timothy M. Hollis, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 10 days.

(21) Appl. No.: 16/940,194

(22) Filed: Jul. 27, 2020

(65) Prior Publication Data

US 2022/0028448 A1    Jan. 27, 2022

(51) Int. Cl.
*G11C 11/24*     (2006.01)
*G11C 11/4093*   (2006.01)
*H04L 27/08*     (2006.01)
*G11C 11/56*     (2006.01)

(52) U.S. Cl.
CPC ........ *G11C 11/4093* (2013.01); *G11C 11/565* (2013.01); *H04L 27/08* (2013.01)

(58) Field of Classification Search
CPC .... G11C 11/4093; G11C 11/565; H04L 27/08
See application file for complete search history.

(56) References Cited

U.S. PATENT DOCUMENTS

| | | | | |
|---|---|---|---|---|
| 5,365,505 A | * | 11/1994 | Fuji | G11B 11/10563 369/59.16 |
| 7,269,212 B1 | * | 9/2007 | Chau | H04L 25/03878 326/80 |
| 2010/0027712 A1 | * | 2/2010 | Poulton | H04L 25/0288 375/295 |
| 2014/0266408 A1 | * | 9/2014 | Guimaraes | H01L 29/94 327/534 |

* cited by examiner

*Primary Examiner* — Uyen Smet
(74) *Attorney, Agent, or Firm* — Dorsey & Whitney LLP (57) ABSTRACT

Apparatuses, systems, and methods for high-pass filtering pre-emphasis circuits. A device may use a pre-emphasis driver to provide a multi-level signal based on multiple binary signals. The pre-emphasis driver includes a primary driver coupled in parallel with at least one equalizer path, each of which includes an equalizer driver and a filtering element. The filtering element may be an AC filtering element, such as a capacitor. The equalizer paths may contribute equalized signal(s) which have a high-pass filtering behavior. The pre-emphasis circuit may combine the primary signal from the primary driver and the equalized signals to generate an overall output multi-level signal. In some embodiments, the pre-emphasis driver may be a pulse amplitude modulated (PAM) driver, such as a PAM4 driver with four levels of the multi-level driver.

20 Claims, 8 Drawing Sheets

APPARATUSES, SYSTEMS, AND METHODS FOR FREQUENCY-DEPENDENT SIGNAL MODULATION

BACKGROUND

Electronic devices may be coupled together, and may transmit data back and forth along physical channels which couple the devices. Some electronic devices may have a greater internal amount of data than there are physical channels. To increase the bandwidth and transmission speed along the channels, internal binary signals may be combined together into a multi-level signal which is provided along the channel. For example, the multi-level signal may have different levels which represent every possible state of the different binary signals (e.g., 2^N levels for N binary signals).

The levels of a multi-bit signal may be represented by a voltage, where a first voltage represents a first level, a second voltage represents a second level, etc. When the multi-level signal changes levels, the voltage of a conductive element may need to be rapidly changed between different levels. However, it may be difficult for drivers to quickly change the voltage level along a conductive element as the level of the multi-bit signal changes over time.

DETAILED DESCRIPTION

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor devices, such as memory devices, may need to convert between binary and multi-level signals. For example, in situations where two devices are coupled, there may be a limited number of connections between the two devices, however each device may use a higher number of signals internally. To mitigate the bottleneck represented by the limited number of inter device connections, some number of internal binary signals may be combined together into a multi-level signal, which is then provided across the inter-device connection. The receiving device may then decode the multi-level signal back into different binary signals. A driver circuit on the transmitting device may generate a voltage along the connection based on the received internal binary signals. Since the various internal binary signals may rapidly change states, it may be useful for the driver circuits which generate the multi-level signals to be able to rapidly transition between different levels of the multi-level signal.

Various driving techniques may be used to control the level of the multi-level signal. For example, a pre-emphasis driver may be placed within a transmitter of the multi-level signal. The pre-emphasis driver may amplify certain characteristics of the signal in order to preserve the rapid transitioning of the signals. However, it may be difficult to rapidly change the voltage of the multi-level signal (e.g., to change between levels) as drivers may have a limited bandwidth to produce the associated rapid changes in voltage.

The present disclosure is drawn to apparatuses, systems, and methods for frequency-dependent signal modulation. The frequency-dependent signal modulation may be used as part of a pre-emphasis driver. A pre-emphasis driver may include a primary driver, an equalizer path, and summing node. The primary driver may receive a plurality of binary signals and provide a multi-level signal to the summing node. The equalizer path may include a secondary driver (e.g., an equalizer driver), which also receives the binary signals in common with the primary driver, and may provide a multi-level signal. The equalizer path may have a frequency-dependent behavior. For example, the equalizer path may include a filtering element. The filtering element may be an AC circuit component, such as a capacitor. The equalizer path may provide a frequency-modulated multi-level signal to the summing node, which may in turn add the primary multi-level signal and the frequency-modulated multi-level signal to provide a composite multi-level signal at the output. In some embodiments, the frequency-dependency of the equalizer paths may take the form of high-pass filtering behavior. For example, the equalizer path may include a high-pass filtering element, such as a capacitor, and the frequency-modulated signal provided by the equalizer path may be a high-pass filtered signal.

Overall the pre-emphasis driver may provide frequency-modulating behavior (e.g., high-pass filtering behavior) when the equalizer path is active. A pre-emphasis driver of the present disclosure may offer advantages such as continuous-time performance (e.g., due to the AC nature of the frequency-modulating component), minimal sensitivity to process, voltage and temperature (PVT) variation, a relatively high signal swing (e.g., compared to de-emphasis approaches), and/or relatively low power and layout size compared to other approaches (e.g., by using a lower power secondary driver and/or a capacitor as the filtering element).

In some embodiments, the pre-emphasis driver may include a plurality of equalizer paths. For example, the equalizer paths may be coupled in parallel with the primary driver. Each of the plurality of equalizer paths may provide a frequency modulated (e.g., filtered) multi-level signal to the summing node. In some embodiments, the plurality of equalizer paths may be selectable, and the device may include one or more settings which determine how many of the equalization paths are active. Increasing the number of active equalization paths may offer increased equalization at the cost of increased power consumption. Increased equalization may offer, for example, improved high-frequency response, which may lead to reduced inter symbol interference (ISI).

Figure 1:
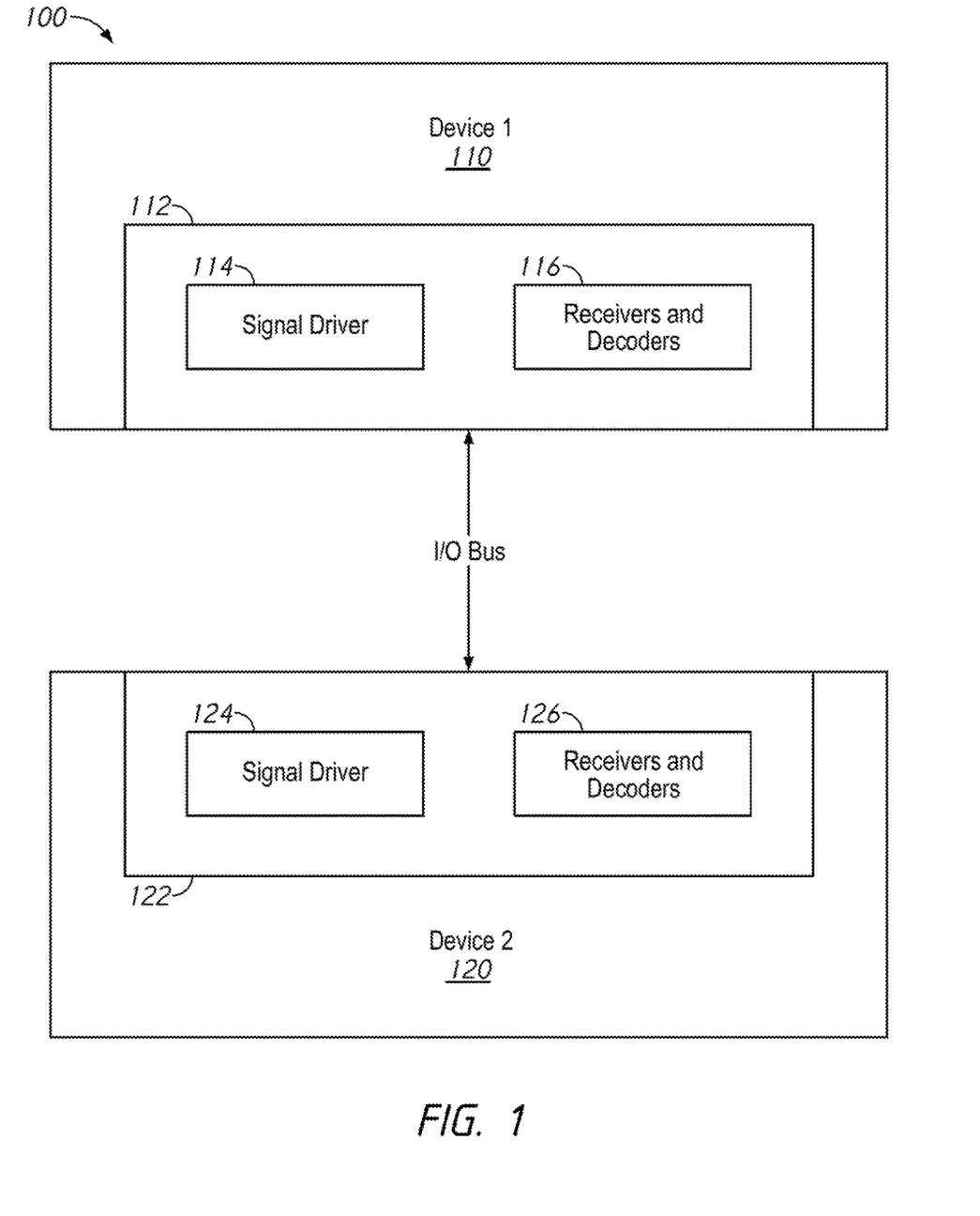
FIG. 1 is a block diagram of an apparatus according to an embodiment of the present disclosure.

FIG. 1 is a block diagram of an apparatus according to an embodiment of the present disclosure. The apparatus 100 may include a first device 110 that communicates with a second device 120 over an input/output (I/O) bus. The first device 110 may include an I/O interface circuit 112 that includes signal driver 114 and receiver and decoder circuit 116 for communication over the I/O bus. The second device 120 may include an I1O interface circuit 122 that includes signal driver 124 and receiver and decoder circuit 126 for communication over the I/O bus. The I/O bus may support a multilevel communication architecture that includes a plurality of channels. In some embodiments, each channel may be single-ended and may include a single signal line. In other embodiments, each channel may include more than one signal line. In one embodiment, the first device 110, the second device 120, and the 110 bus may support a channel that includes conversion of M binary signals to N multilevel signals, where M is greater than N.

In some embodiments, the binary signals may be organized as one or more bitstreams. A bitstream includes a plurality of bits provided serially, wherein each bit of the bitstreams is provided over an interval of time, that may be referred to as a data interval. For example, a first bit is provided for a first interval, and a second bit is provided for a second interval following the first interval, and a third bit is provided for a third interval following the second interval, and so on. The successive bits provided in this serial manner represent a stream of bits. The corresponding bits of each bitstream for a data interval represents data M bits wide. In some embodiments, the binary signals may be provided in parallel with each other, and may be received simultaneously at the I/O interface circuit 112. For example, a first bit may be received along a first conductive element during a data interval, and a second bit may be received along a second conductive element during a same data interval. In some embodiments, combinations of serial and parallel transmission may be used.

A multilevel signal may have one of three or more voltage levels (in contrast to binary signals which may have one of two voltage levels to represent a data value), where the voltage level of the multilevel signal represents a data value. The N multilevel signals may be transmitted over the I/O bus. Each multilevel signal is provided over a data interval having a voltage corresponding to one of multiple voltage levels (e.g., 2 different voltage levels, 4 different voltage levels, 8 different voltage levels, etc.), where each of the multiple voltage levels represents a different data value. In one example, 3 binary signals may be converted to 2 tri-level signals. In another example, pulse-amplitude modulation (PAM) may be used to convert 2, 3, or 4 bitstreams into a single multilevel signal having 4, 8, 16, etc., levels.

For example, in a memory device having 8 input/output (I/O) terminals, total of 64 bits of data can be accessed (e.g., read or written) in a column operation. That is, each of 8 I/O terminals may be provided with 8 bits of serialized data, resulting in a total of 64 bits of data (e.g., 8 I/O terminals multiplied by 8 bits (in serial) per I/O terminal). In the memory device, a set of 8 bits of data is converted in series using a first-in, first-out (FIFO) circuit coupled with time multiplexing methods because there are 8 I/O terminals (not 64). In an embodiment of the disclosure, for example, where 2 bits are converted to a multilevel signal (e.g., having one of four different voltage levels to represent the 2 bit value), the 8 serialized data can be converted into 4 serialized data, or 8 I/O terminals can be reduced to 4 I/O terminals (where each of the 4 I/O terminals is provided with 8 bits of serialized data).

In some examples, the first device 110 may include a memory controller or processing system and/or the second device 120 may include a memory, including volatile memory and/or non-volatile memory. In some examples, the second device 120 may include a dynamic random access memory (DRAM), such as a double-data-rate (DDR) DRAM or a low power DDR DRAM. It should be noted, however, that a memory is not a necessary component of the disclosure. Rather, the disclosure may be applied to any two or more devices, on or off-chip, that communicate with one another using multilevel signaling.

The signal driver 114 may include circuitry that applies a conversion to a set of M binary signals to generate N multilevel signals and the signal driver 113 may drive the N multilevel signals onto channels of the I/O bus. Similarly, the signal driver 124 may include circuitry that applies a conversion to a set of M binary signals to generate N multilevel signals and drives the N multilevel signals onto channels of the I/O bus. The signal driver 114 (and/or 124) may act as a pre-emphasis driver to emphasize (e.g., amplify) certain aspects of the multi-level signal along the I/O bus. For example, the rising and falling edges of the signal may become sharper (e.g., the signal may rise or fall faster). The signal driver 114 (and/or 124) may, for example, include one or more equalizer paths, which may be selectively activated to give the pre-emphasis driver frequency-modulated behavior, such as the characteristics of an active high-pass filter. This in turn may help equalize high frequency aspects of the channel on the signal, such as when the channel inhibits multi-level signal changes between one level and another. In some embodiments, the device 110 may include settings logic (not shown) to determine how many equalizer paths are active.

The driver 114 (and/or 124) may convert the M binary signals into the N multilevel signals using various techniques now known or later developed. For example, in some embodiments of the disclosure, a PAM4 technique may be used to convert two-bit data into a multilevel signal having one of four different voltage levels. In other embodiments of the disclosure, a PAM8 technique may be used to convert three-bit data into a multilevel signal having one of eight different voltage levels. Other conversion techniques may be used as well without departing from the scope of the disclosure.

For each channel, the receiver and decoder circuit 116 may include decoders configured to recover the set of M binary signals by decoding the N multilevel signals received via the channels of the I/O bus as provided by the signal driver 124. Further, the receiver and decoder circuit 126 may include decoders configured to recover the set of M binary signals by decoding the N multilevel signals received via the channels of the I/O bus as provided by the signal driver 114. In some embodiments, the receiver and decoder circuit 116 and the receiver and decoder circuit 126 may include comparators and decoding logic to recover the set of M binary signals.

In operation, the first device 110 and the second device 120 may communicate over the I/O bus to transfer information, such as data, addresses, commands, etc. While the I/O bus is shown to be bidirectional, the I/O bus may also be a unidirectional bus. The I/O interface circuit 112 and I/O interface circuit 122 may implement a multilevel communication architecture. In a multilevel communication architecture, data may be sent over a channel during a data interval. Data may include a single value on a signal line of a channel, or may be a combination of values provided on a plurality of signal lines of a channel. The data may represent a channel state. A receiver may determine an output signal value based on the value transmitted on the signal line(s) of a channel. In a single-ended architecture, the signal line value may be compared against one or more reference values to determine the output signal value. A receiver has a time interval to determine and latch the output signal value from the time the output signal transitions to the current value to the time the output signal transitions to the next value. The transition time may be determined based on a clock signal, as well as a setup and hold time based on a transition from one value to another. In addition to mitigating the frequency-dependent signal degradation imposed by the channel (e.g., ISI), in a multilevel communication architecture with a fixed slew rate or fixed rise/fall times, inherent jitter may occur due to differing magnitude shifts. The amount of jitter may be based on the slew rate, the rise/fall times, the multilevel magnitudes' values, or combinations thereof. In some examples, the transition times may also be affected by process, voltage, and temperature variations. The use of pre-emphasis techniques and equalizer paths in the signal driver 114 (and/or 124) may help mitigate one or more of these effects.

In an example, the signal driver 114 may generate data for a channel by converting a bit from each of the M binary signals during a data interval into N multilevel signals. The data may be transmitted to the receiver and decoder circuit 126 via N signal lines of the I/O bus. The receiver and decoder circuit 126 may detect levels on the N signal lines and decode the levels to retrieve the bit from each of the M streams. By using multilevel signal lines, more data can be transmitted during a data interval as compared with using binary signal line levels. In an example, M is 2 and N is 1, and the signal lines of the I/O bus are capable of being driven to four independent voltage levels (e.g., in a PAM implementation such as a four-level signal PAM4). Communication protocol between the signal driver 124 and the receiver and decoder circuit 116 may be similar to the communication protocol between the encoder and signal driver 114 and the receiver and decoder circuit 126. The signal driver 114 may include a DRAM driver that has been segmented to drive multiple (e.g., more than 2) voltage levels on a signal line.

Figure 2:
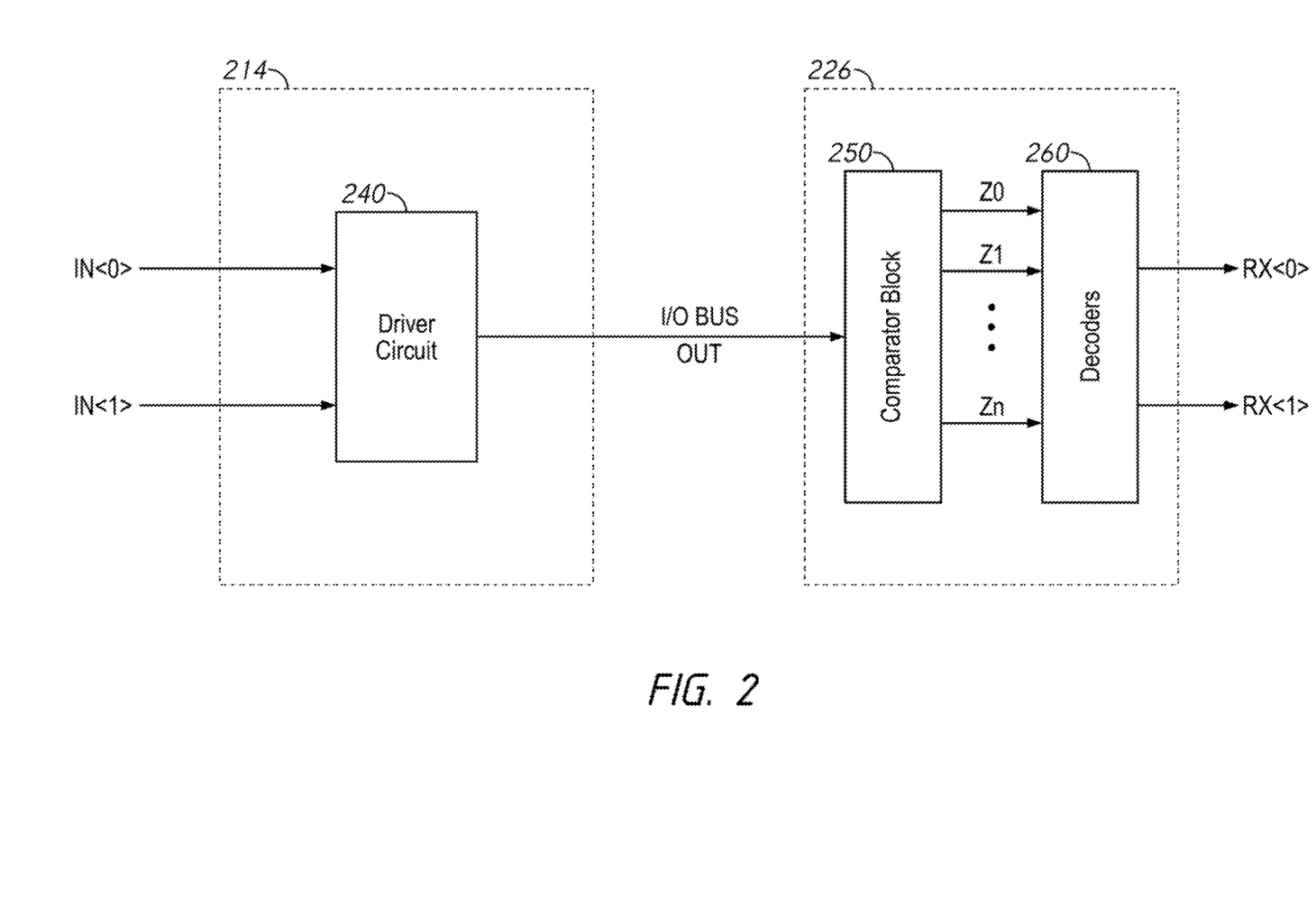
FIG. 2 is a block diagram of an apparatus for a multilevel communication architecture according to an embodiment of the disclosure.

FIG. 2 is a block diagram of an apparatus for a multilevel communication architecture according to an embodiment of the disclosure. The apparatus may include a signal driver 214 coupled to a receiver 226 via an I/O bus. The signal driver 214 may be implemented in the signal driver 114 and/or the signal driver 124 of FIG. 1 and the receiver 226 may be implemented in the receiver and decoder circuit 116 and/or the receiver and decoder circuit 126 of FIG. 1.

The signal driver 214 may include a driver circuit 240. The driver circuit 240 may receive bitstreams IN<1> and IN<0> and drive an output signal OUT in response. The IN<1> and IN<0> bitstreams may represent a stream of two-bit data. The output signal OUT driven by the driver circuit 240 is based on the IN<1> and IN<0> bitstreams. For example, the input signals IN<0> and IN<1> may be considered to be least significant bit (LSB) and most significant bit (MSB) of a binary number. The output signal OUT may be a multi-level signal with different levels to represent the four possible values of IN<0> and IN<1>. A PAM4 technique may be used in some embodiments of the disclosure to convert the two-bit data of the IN<1> and IN<0> bitstreams into a multilevel signal having one of four different voltage levels.

The receiver 226 may include a comparator block 250 coupled to a decoder 260. The comparator 250 may be configured to receive the signal from the I/O bus and provide Z0-Zn signals (n is a whole number) to the decoder 260. The comparator block 250 may include circuits (not shown in FIG. 2) configured to compare the signal from the I/O bus against reference signals to provide the Z0-Zn signals. For example, the comparator block 250 may include comparators that compare the OUT signal from the I/O bus against various reference signals to provide the Z0-Zn signals. The decoder 260 may include logic to generate the bitstreams RX<0> and RX<1> based on the Z0-Zn signals from the comparator block 250. The RX<0> and RX<1> bitstreams may be logical equivalents of data transmitted by the IN<0> and IN<1> bitstreams. The RX<0> and RX<1> bitstreams may represent a stream of two-bit received data.

In operation, the IN<0> and IN<1> may be bitstreams to be transmitted over the I/O bus. Rather than send each bitstream on a separate signal line, the signal driver 214 may provide a signal based on the IN<0> and IN<1> bitstreams to be transmitted over a signal line using a multilevel signal. For example, the signal driver 214 may receive the IN<0> and IN<1> bitstreams, and during each data interval, the driver circuit 240 may drive the signal line of the I/O bus with a voltage that will be used by the receiver 226 to provide the RX<0> and RX<1> bitstreams. The multilevel signal may be used to represent data of the IN<0> and IN<1> bitstreams using fewer signal lines than one signal line per bitstream. For example, as in the embodiment of FIG. 2, data of the IN<0> and IN<1> bitstreams are provided to the receiver 226 on fewer than two signal lines (e.g., one signal on the I/O bus rather than one signal line for the IN<0> bitstream and another signal line for the IN<1> bitstream).

Although FIG. 2 illustrates operation with bitstreams IN<0> and IN<1> for providing bitstreams RX<0> and RX<1>, the number of bitstreams may be different in other embodiments of the disclosure. For example, in some embodiments of the disclosure, a third bitstream IN<2> may also be provided to the signal driver 214 in addition to the IN<0> and IN<1> bitstreams and a multilevel signal may be provided over the I/O bus representing the data from the IN<0>, IN<1>, and IN<2> bitstreams. Such embodiments are within the scope of the present disclosure.

Figure 3:
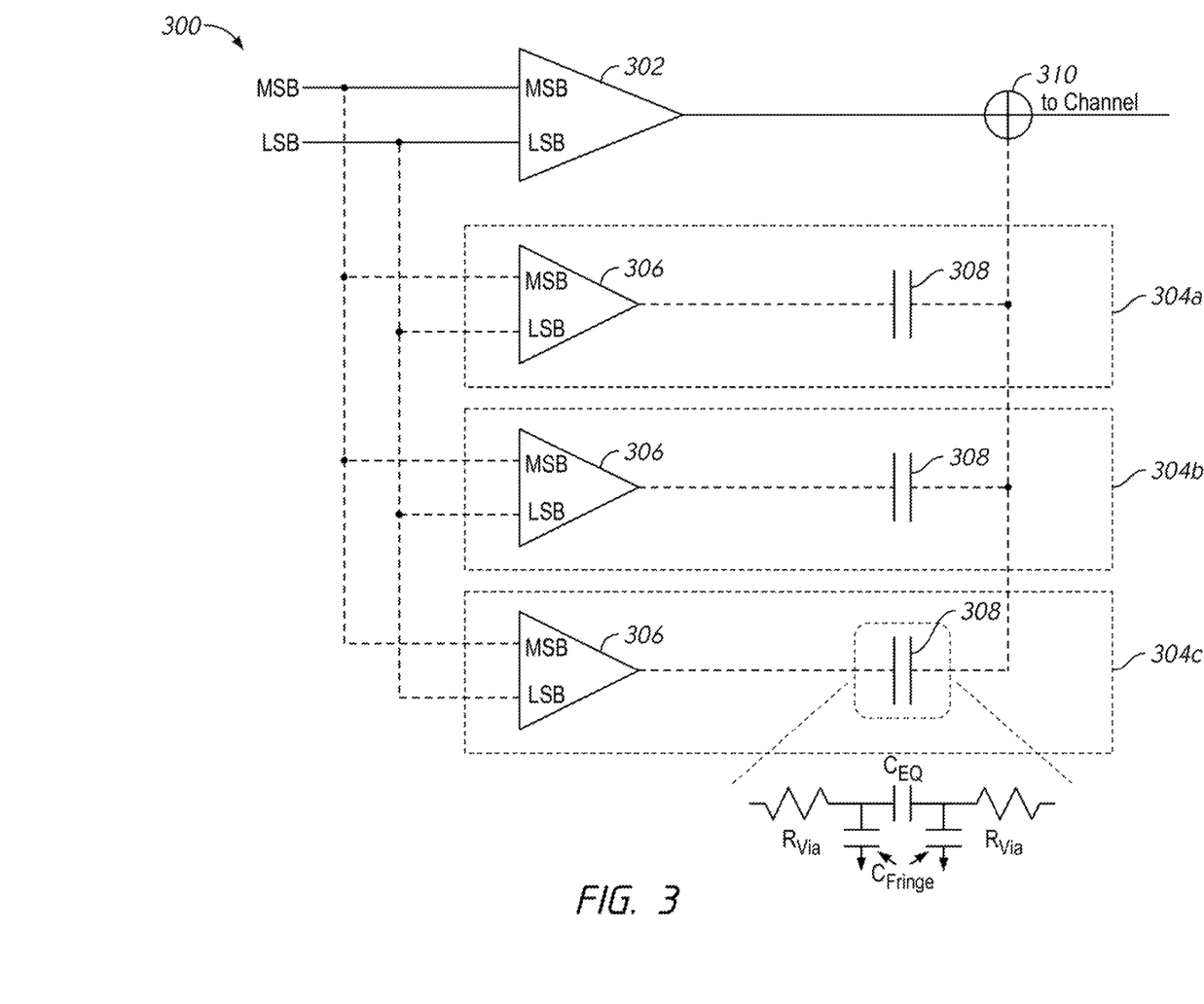
FIG. 3 is a schematic diagram of a pre-emphasis driver according to some embodiments of the present disclosure.

FIG. 3 is a schematic diagram of a pre-emphasis driver according to some embodiments of the present disclosure. The pre-emphasis driver 300 may, in some embodiments, be included in the signal drivers 114/124 of FIG. 1 and/or the driver circuit 240 of FIG. 2. The example pre-emphasis driver 300 of FIG. 3 is shown configured for a PAM4 signal architecture, where two binary input signals MSB and LSB are converted into a multi-level signal with four levels. Other signal architectures may be used in other embodiments.

The pre-emphasis driver 300 includes a primary driver 302 as part of a primary signal path, and a number of equalizer paths 304a-c. The example embodiment of FIG. 3 shows three equalizer paths 304a-c, although more or fewer equalizer paths may be used in other example embodiments. In some embodiments, only a single equalizer path (e.g., 304a) may be used. In some embodiments, additional equalizer paths (not shown) may be used. The primary driver 302, and each of the equalize paths 304a-c have input nodes coupled in common to the signals MSB and LSB. The primary driver 302 and each of the equalizer paths 304a-c also have output nodes coupled in common to a summing node 310. The primary driver 302 may thus represent a primary driver path which is in parallel with all of the equalizer paths 304a-c between the input signals MSB and LSB and the summing node 310. The summing node 310 provides a signal to the channel (e.g., the I/O channel of FIG. 1).

The primary driver 302 may receive the signals MSB and LSB and generate a multi-level signal based on those input signals. Each of the equalizer paths 304a-c includes an equalizer driver 306 and a a frequency-modulating element. In the embodiment of FIG. 3, a filtering element 308, in particular a capacitor, is used as the frequency-modulating element. Other types of frequency-modulating elements and other types of filtering element may be used in other example embodiments.

When active, the equalizer driver 306 receives the input signals MSB and LSB and provides a multi-level output signal in a manner analogous to the primary driver 302. In some embodiments, the equalizer driver 306 may be smaller (e.g., lower power, smaller component transistors) than the primary driver 302. For example, the equalizer driver 306 may be about 0.1× the size of the primary driver 302. Each equalizer path 304a-c also includes a filtering element 308, which may act as a high-pass filter of the signal provided by the equalizer driver 306. Example details of the primary and equalizer driver are discussed in more detail in FIG. 5.

The filtering element 308 may be an AC circuit element, such as a capacitor. The use of an AC circuit element may decouple the filtering effect from the length of the signaling interval, and make the pre-emphasis filter operate in a continuous manner. The capacitor may be coupled between an output node of the associated equalizer driver 306 and the summing node 310. Due to the filtering element 308 (e.g., the capacitor) each of the equalizer paths 304a-c may have a transfer function which acts as a high-pass filter. For example, each equalizer path 304a-c may have an individual equivalent resistance $R_{EQ}$ and a series capacitance $C_{EQ}$. As shown in the inset, these may, in some embodiments, have contributions from the inherent resistances $R_{Via}$ of the capacitors, and fringe capacitance $C_{Fringe}$ (e.g., between metal layers of the chip). The first equalizer path 304a may have a first resistance $R_{EQ}a$ and capacitance $C_{EQ}a$, the second path 304b may have a second resistance $R_{EQ}b$ and capacitance CEO, and the third path 304c may have a third resistance $R_{EQ}c$ and capacitance $C_{EQ}c$. In some embodiments, each path 304a-c may have a same value for their respective resistance $R_{EQ}$ and capacitance $C_{EQ}$.

Accordingly, when at least one equalizer path is active, the capacitors 308 may give the active path the behavior of a high-pass filter with a cutoff frequency based on the values of $C_{EQ}$ and $R_{EQ}$. This may give the overall driver 300 an effective resistance Reff and effective capacitance Ceff, which in turn may give the overall high-pass filtering behavior. The number of active equalizer paths 304a-c may determine the overall value of Reff and Ceff. For example, the values of Ceff and Reff may vary between a minimum value (e.g., no equalizer paths 304a-c active) to a maximum value (e.g., all equalizer paths 304a-c active).

In other examples, a different type of filtering element 308 may be used to achieve high-pass filtering (or a different form of frequency-modulated response). For example, in some embodiments, the inductance of the equalizer paths 304a-c may be based on passive or active inductance of the equalizer driver 306 (e.g., based on the way the transistors of the equalizer driver 306 are coupled together). In some embodiments, the filtering element 308 may include a resistor in series with a capacitor. In some embodiments, the filtering element 308 may include a resistor and a shunt inductor. Other forms of filtering element 308 are possible in other examples.

The active equalizer paths 304a-c may contribute an equalized (e.g., high-pass filtered) signal to the summing node 310, which may give the overall output signal enhanced performance in high frequency (e.g., rapid switching) behaviors. The equalized signal may decay over time (e.g., due to the capacitor) which may give the overall output signal a strong response after a change in level of the multi-level signal (e.g., from the both the equalized signal and the primary signal), which levels off over time to just the level of the primary signal (e.g., as the equalized signal drops to negligible levels). The choice of different types of capacitors and different values of $C_{EQ}$ and $R_{EQ}$ is discussed in more detail in FIG. 6. The activation of different numbers of equalizer paths 304a-c is discussed in more detail in FIG. 7.

Different types of capacitors 308 may provide different benefits and drawbacks for the overall performance of the pre-emphasis driver 300. In some embodiments, metal-oxide semiconductor capacitors (MOScaps) may be used as the capacitors 308. The MOScap may, for example, be formed between the gate of a transistor and a shorted source-drain of the transistor. The MOScap may offer advantages such as being relatively area efficient and relatively high bandwidth, as well as relatively low cost to implement on a memory device. In some embodiments, fringe capacitance, such as the capacitance formed through interleaving metal routing over multiple layers on a chop and relying on the proximity of the traces (e.g., in horizontal and/or vertical dimensions) to generate capacitance may be used to implement the capacitors 308. In some embodiments, the capacitors 308 may be a repurposed memory cell capacitor or a metal-insulator-metal capacitor (MIMcap).

The summing node 310 may receive the multi-level signals from the primary driver 302 and any activated ones of the plurality of equalizer paths 304a-c and combine them into an output multi-level signal. In some embodiments, the summing node 310 may be a conductive node coupled in common to the outputs of the primary driver 302 and the equalizer paths 304a-c.

Compared to the primary driver 302, each equalizer path 304a-c has a transfer function which emphasizes high frequency elements due to the capacitor 308. The capacitor may also give the equalizer path a decay over time, such that the equalizer path(s) 304a-c may contribute to the output signal after a change in the input signals MSB and LSB, and the contribution from the path(s) 304a-c may then decay over time. Accordingly, the overall transfer function of the pre-emphasis circuit may have an increased response to high-frequency elements, such as quick changes in voltage when the output multi-level signal changes levels. This may allow the pre-emphasis driver to more quickly respond to changes in level, with a more dramatic swing from a first level to a second level. This, in turn, may improve the detection of different levels of the multi-level signal.

The response of the pre-emphasis circuit 300 may be changed by selecting more or fewer of the equalizer path 304a-c. Each equalizer path 304a-c may only provide an equalized multi-level signal when that path is selected. For example, select signals (not shown) may be used to activate the equalizer driver 306 (e.g., by providing power to the equalizer driver 306). Other methods may also be used to adjust the equalizer response, for example by adjusting the drive strength (inverter size) in the equalizer path, and/or by enabling/disabling capacitance in the equalizer path.

Figure 4:
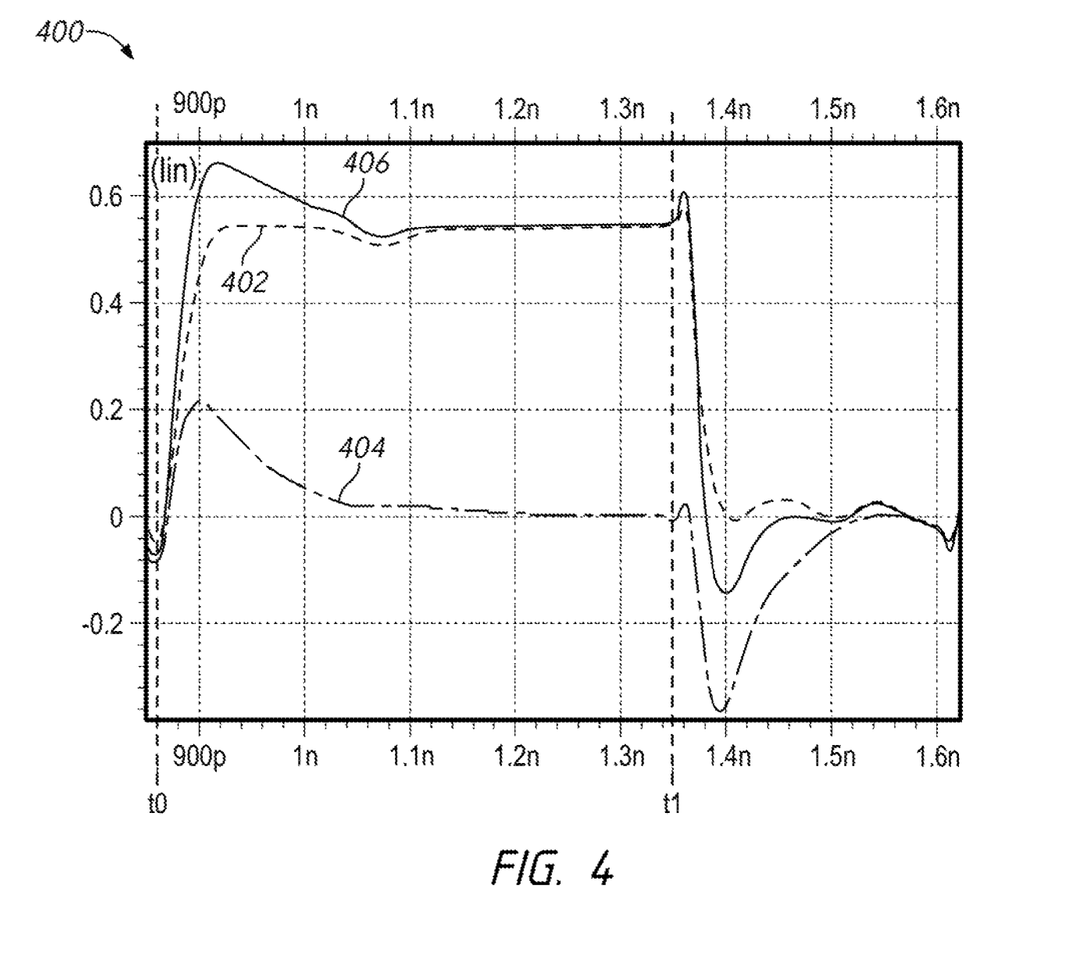
FIG. 4 is a graph of an example operation of a pre-emphasis driver according to some embodiments of the present disclosure.

FIG. 4 is a graph of an example operation of a pre-emphasis driver according to some embodiments of the present disclosure. The graph 400 may, in some embodiments, represent the operation of a pre-emphasis driver such as the pre-emphasis driver 300 of FIG. 3. The graph shows voltage as a function of time. While certain values are shown for both voltage and time, it should be understood that these are examples only, and that higher or lower voltages, and slower or faster speeds, may be used in other example embodiments.

The first trace 402 shows the output of the primary driver (e.g., 302 of FIG. 3). The second trace 404 shows the output of the equalizer paths (e.g., 304a-c of FIG. 3). The third trace 406 shows the combined output multi-level signal (e.g., as provided by summing node 310).

At an initial time t0, the pre-emphasis driver is activated. For example, it may receive binary signals which cause it to provide the multi-level signal at a certain level (e.g., of about 0.5V). As may be seen, the output of the primary driver 402 rises to this level, but does not go above it. The output of the equalizer path(s) 404 shows an immediate rise to a lower level which then exponentially decays due to the capacitance $C_{EQ}$ of the filtering element (e.g., 308 of FIG. 3). The output of the equalizer path(s) 404 may show a quick response to the change in output level due to the AC based high-pass filtering of the filtering element. As may be seen from the overall output 406, the overall output shows both the strong initial response of the equalizer path 404, which then levels off to the high voltage level provided by the primary driver. The overall output signal 406 may rise more rapidly than the signal 402 (e.g., than without an active equalizer path) and may overshoot the output level, which may make it easier to detect a change in the multi-level output signal 406. This may, for example, allow data rate to be increased due to this edge boost, which compensates for the channel loss.

At a first time t1, the signal is ended, and the pre-emphasis driver returns to providing the initial voltage level. As may be seen, the equalizer path 404 shows a large initial response which decays over time, which causes a strong response in the overall output trace 406.

Figure 5:
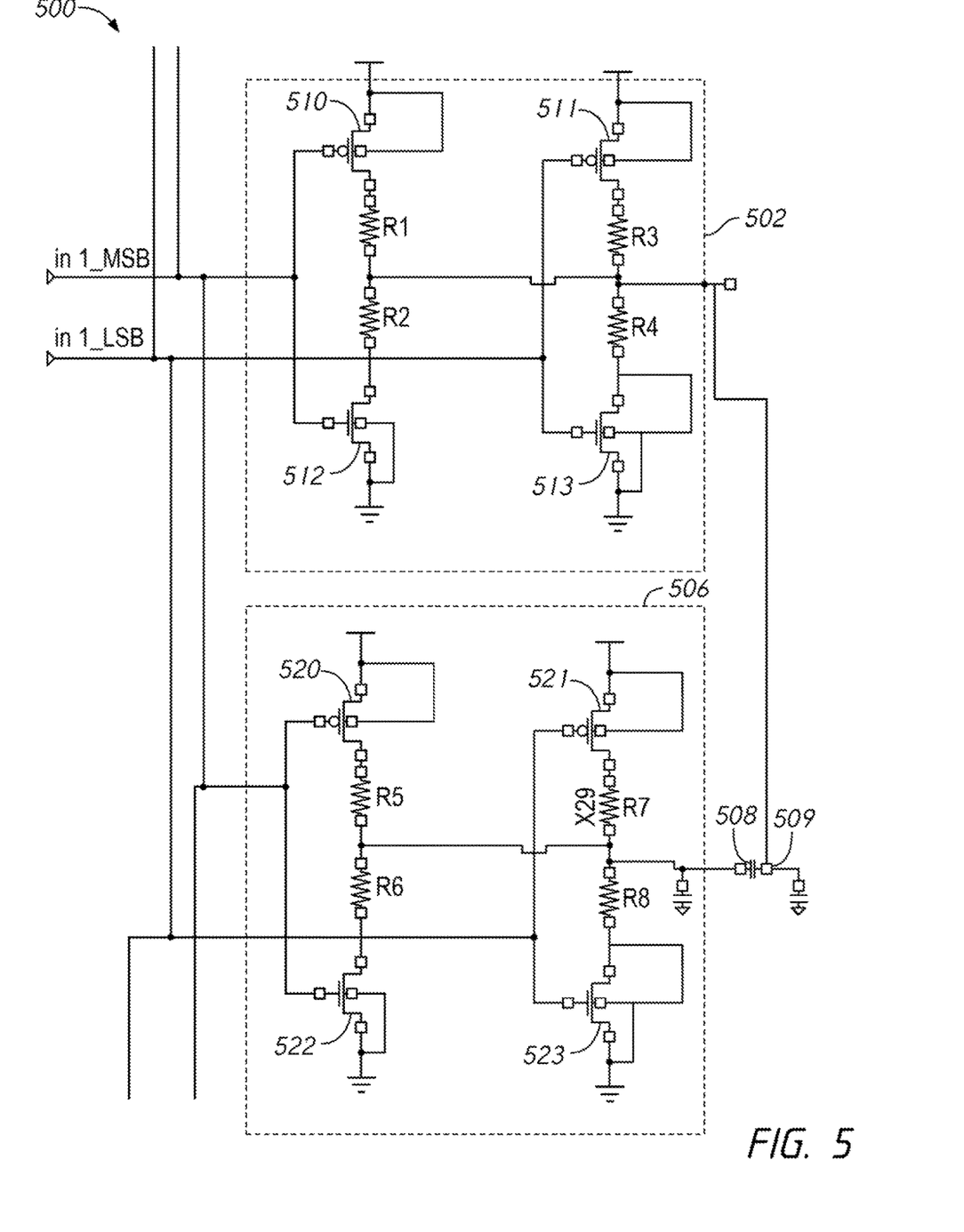
FIG. 5 is a schematic diagram of a pre-emphasis driver according to some embodiments of the present disclosure.

FIG. 5 is a schematic diagram of a pre-emphasis driver according to some embodiments of the present disclosure. The pre-emphasis driver 500 may, in some embodiments, be included in the pre-emphasis driver 300 of FIG. 3. The pre-emphasis driver 500 includes a primary driver 502 (e.g., primary driver 302 of FIG. 3) and an equalizer path which includes an equalizer driver 506 and a capacitor 508 (e.g., equalizer driver 306 and filtering element 308 of FIG. 3).

The primary driver 502 includes four transistors 510-513 and four resistors R1-R4. These work together to generate an output signal which has one of four voltage levels (e.g., a multilevel signal) based on the states of the two input binary signals MSB and LSB. In particular, the two input binary signals may represent a numerical value between 0 and 3 in binary with the signal MSB as the most significant bit and the LSB as the least significant bit (e.g., 00, 01, 10, and 11). In some examples, the output voltage may be a lowest level when the value is 00, a next lowest level when the value is 01, etc. The primary driver 502 may use the transistors 510 as switches to configure a voltage divider using two of the resistors R1-R4.

The first transistor 510 is a p-type transistor with a source coupled to a first system voltage Vdd, a gate coupled to the MSB signal, and a drain coupled through R1 to the output node. The second transistor 512 is an n-type transistor with a source coupled to a second system voltage Vss, which is lower than Vdd, such as a ground voltage, a gate coupled to the signal MSB, and a drain coupled through R2 to the output node. The third transistor 511 is a p-type transistor with a source coupled to Vdd, a gate coupled to the signal LSB, and a drain coupled through R3 to the output node. The fourth transistor 513 is a n-type transistor with a source coupled to Vss, a gate coupled to the signal LSB, and drain coupled through R4 to the output node.

In operation, when the signals MSB and LSB are both low (e.g., the value of 00), then the transistors 512 and 513 may both be inactive while the transistors 510 and 511 are both active, and the output node 509 may have a voltage of Vdd. When the signal LSB is high, but MSB is low (e.g., the value 01), the transistors 510 and 513 may both be active and the output node may be coupled to Vdd through R1 and Vss through R4. The resistors R1 and R4 may thus act as a voltage divider, and the output node may have a voltage based on the ratio of R1 and R4. In similar fashion, when the signal MSB is high and LSB is low (e.g., a value of 10), then the resistors R2 and R3 may act as a voltage divider and the voltage of the output node may be based on the ratio of R2 and R3. When both the signals MSB and LSB are active, the transistors 512 and 513 may both be active, and the output node is coupled to Vss. The output of the primary driver 502 is coupled to a summing node 509, which provides an overall output voltage (e.g., a multi-level signal). In some embodiments, the multibit data might be pre-encoded prior to multilevel signal transmission such that the final decoded data within the receiver might not track the assignments just described. For example, when Gray-coding may be integrated into the signaling scheme.

The equalizer driver 506 may generally be analogous to the primary driver 502, and for the sake of brevity, the operation of the equalizer driver 506 will not be described in detail. The equalizer driver 506 includes resistors R5-R8 which may be selectively coupled between the voltages Vdd and Vss to the output node of the equalizer driver 506 (which is coupled through capacitor 508 to the summing node 509. In some embodiments, the resistors R5-R8 may be chosen to have different values than their associated resistors R1-R4. In some embodiments, the resistors R5-R8 may be chosen such that the output of the equalizer driver 506 is generally lower than the output of the primary driver 502. In some embodiments, the transistors 510-513 (and/or 520-523) may have a resistance which contributes to the overall Reff of the driver. In some embodiments, the resistances of the transistors may be tuned to different values, and the resistors R1-R4 (and/or R5-R8) may be omitted.

Figure 6:
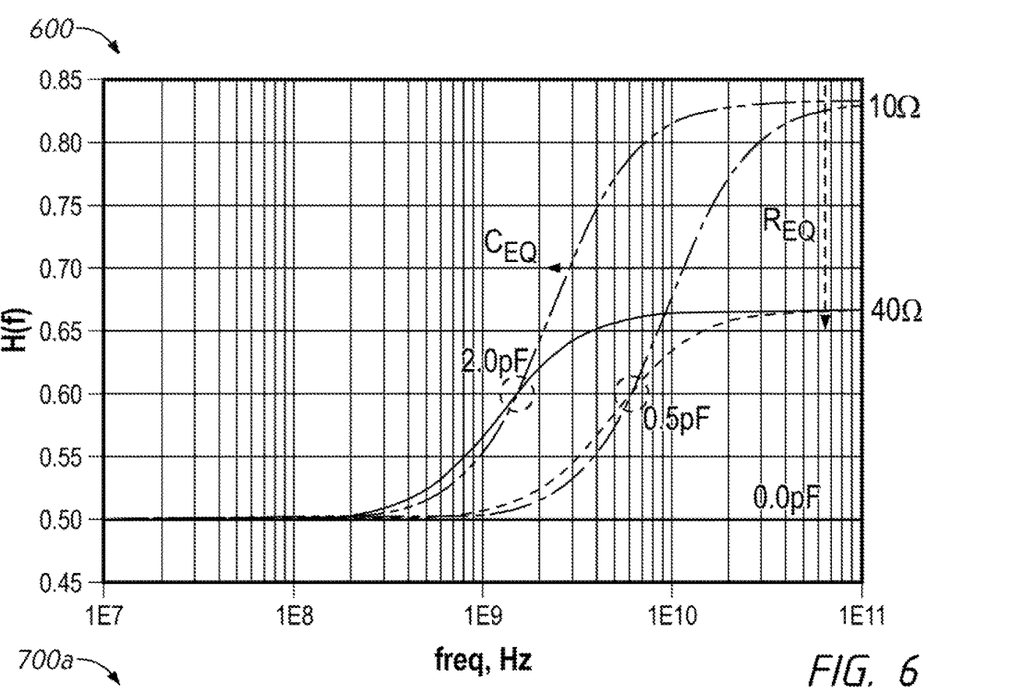
FIG. 6 is a graph of a transfer function of a pre-emphasis driver based on different values of capacitor according to some embodiments of the present disclosure.

FIG. 6 is a graph of a transfer function of a pre-emphasis driver based on different values of capacitor according to some embodiments of the present disclosure. The graph 600 shows the transfer function H as a function of frequency representing two different values of resistance $R_{EQ}$ and two different values of capacitance $C_{EQ}$. In particular, the graph 600 shows resistance $R_{EQ}$ values of 10Ω and 40Ω and capacitances $C_{EQ}$ of 2.0 pF and 0.5 pF.

As may be seen from the graph 600, the overall transfer function H(f) functions as a high-pass filter, with frequencies below a cutoff having a lower value of the transfer function than frequencies above the cutoff. Increasing the capacitance lowers the frequency which acts as a cutoff, while increasing the resistance decreases the differences between the value of the transfer function before and after the cutoff. Accordingly, as more equalizer paths are activated (e.g., and more capacitors are coupled in parallel) the overall $C_{EQ}$ may increase, and the cutoff frequency may decrease.

Figure 7A:
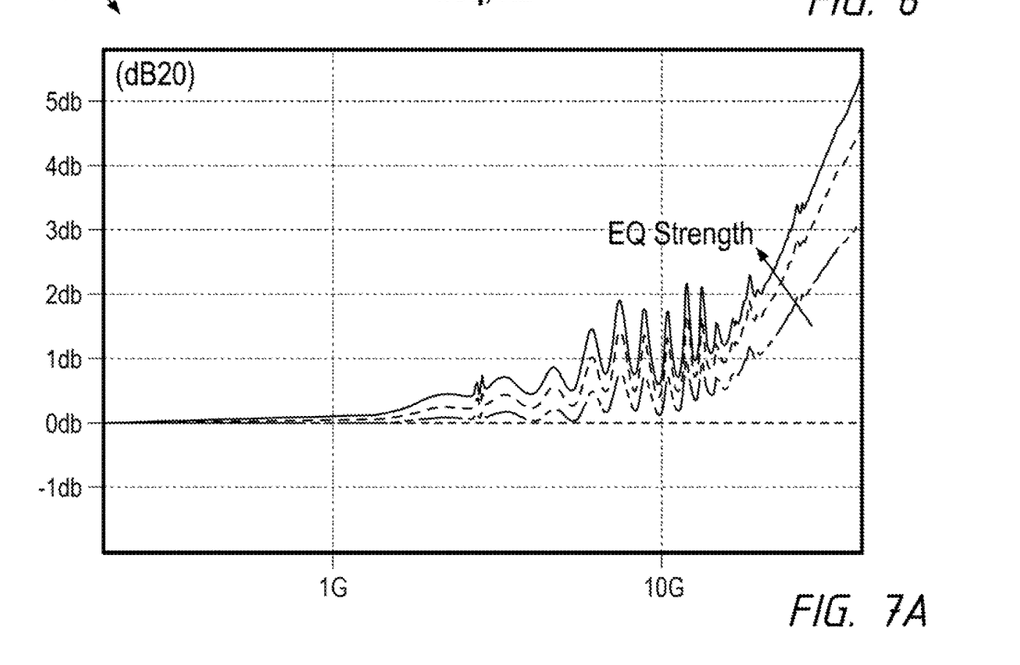
FIGS. 7A-C are a set of graphs which show example effects of increasing the number of active equalization paths according to some embodiments of the present disclosure.
Figure 7B:
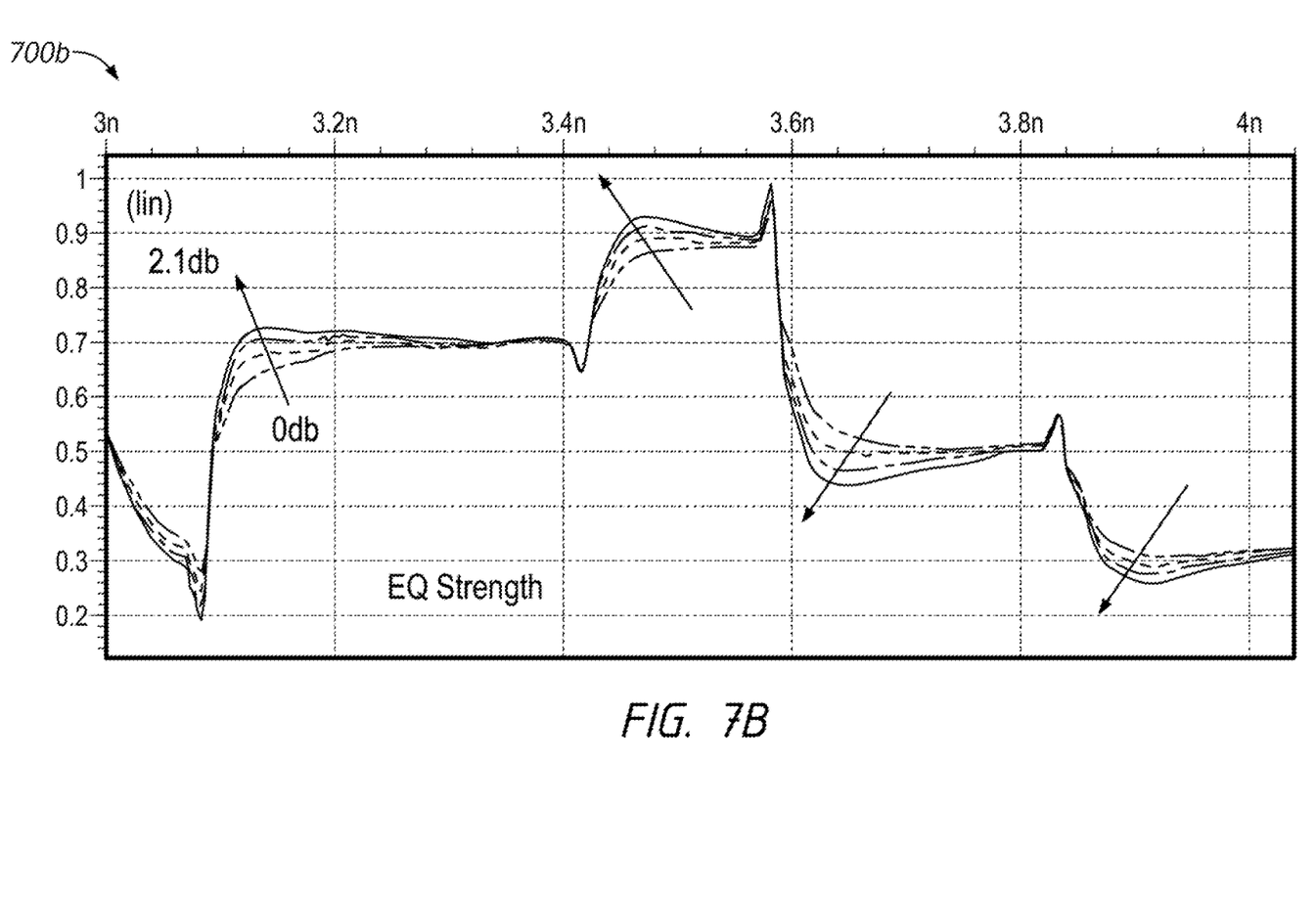
Figure 7C:
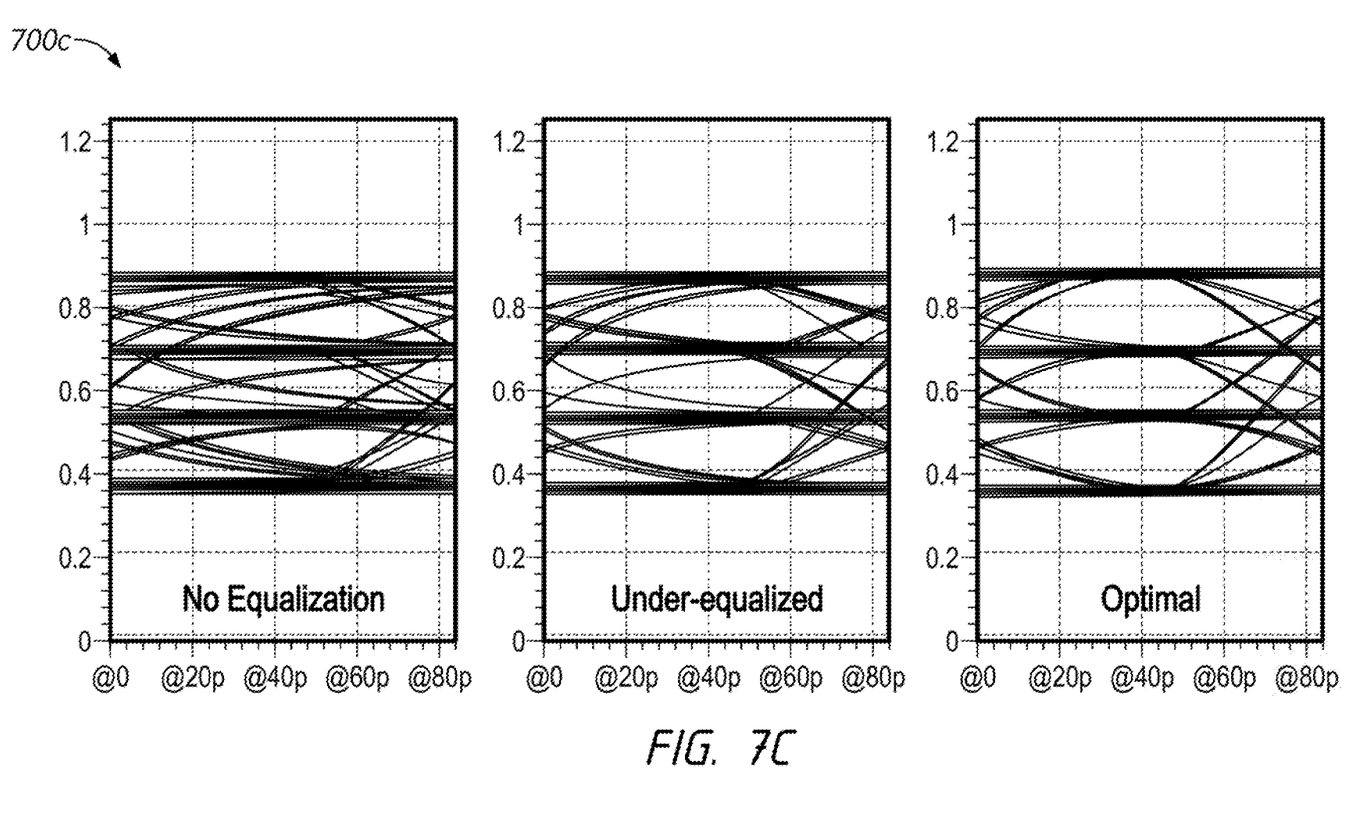

FIGS. 7A-C are a set of graphs which show example effects of increasing the number of active equalization paths according to some embodiments of the present disclosure. The graphs 700a-700c, of FIGS. 7A-C respectively, show different ways of characterizing the behavior of a pre-emphasis circuit as more or less equalizer paths (e.g., paths 304a-c) are activated where more active equalizer paths represent increasing equalizer (EQ) strength. Although the graphs 700a-c show various values of time, frequency, db, etc. these should be understood to be examples only, and other values may be used in other example embodiments.

Graph 700a shows a frequency response of the circuit. When no equalizer paths are active, the circuit may have a flat frequency response (e.g., 0 db). As the equalizer strength increases (as indicated by the arrow, the slope of the response increases.

Graph 700b shows a time domain response of a pre-emphasis driver, as the driver outputs different levels over time (level 3, level 4, level 2, level 1 as shown). The arrows represent increasing equalization strength at the transitions between the levels from 0 db (no equalizer paths active) to 2.1 db (all equalizer paths active). As may be seen, as the level of equalization increases, the multi-level signal has sharper 'corners' as it transitions between levels. It also changes levels more rapidly. This may, for example, make it easier for the receiving circuit to determine transitions between the levels.

Graph 700c represents a data eye visualization of data transmitted using a pre-emphasis driver at three different levels of equalization (e.g., more or less equalizer paths active). The leftmost part of graph 700c shows no equalization (e.g., no equalizer paths active), the middle part shows under-equalization (e.g., 1 equalizer paths active), and the rightmost part shows optimal equalization (e.g., 3 equalizer paths active). While the example of graph 700c shows 3 equalizer paths as the optimum, it should be understood that more or fewer equalizer paths may be optimal in other situations. The graphs 700c show a multi-level output signal with four levels (e.g., a PAM4 signal). As may be seen, as the number of active equalizer paths increases, the data eye opens up, showing more rapid (and cleaner) transitions between the different levels of the multi-level signal.

A device including the pre-emphasis driver may have a selectable number of activate equalizer paths (e.g., paths 304a-c of FIG. 3). In some embodiments, the number of active paths may be a device setting. The number of active equalizer paths may be permanently set, for example by blowing one or more fuses of the device. For example, testing of the device (e.g., during packaging or assembly) may measure a response of the pre-emphasis driver and be used to determine an optimal number of active equalizer paths, and fuses may be blown to set that optimal number as active.

In some embodiments, the number of active equalizer paths may be a customer setting. For example, in some situations a customer may determine that they prefer to improve the performance of the pre-emphasis circuit (at the cost of greater power draw) and may set all the equalizer paths active by, for example, blowing fuses or setting a property of a mode registers. In some situations, a customer may prefer lower power consumption and choose to have less equalizer parts active.

In some embodiments, the device may use a training process to determine how many of the equalizer paths to activate. For example, during initialization, the device may provide test signals to the pre-emphasis driver and measure one or more properties of the response of the multi-level signal. The device may then determine an optimal number of equalizer paths and then save that setting (e.g., as a value in a mode register). In some embodiments, the training process may be iterative, and the device may adjust the number of active equalizer paths until the performance of the multi-level signal is within an acceptable tolerance. In some embodiments, the device may continuously monitor the multi-level signal during operation, and may continuously and/or intervalically update the number of active equalizer paths based on that monitoring.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
  a primary driver circuit configured to receive a plurality of binary signals and provide a first multi-level signal;
  an equalizer path including an equalizer driver and a capacitor, wherein the equalizer path is configured to receive the plurality of binary signals and provide a second multi-level signal, wherein the primary driver circuit and the equalizer driver are coupled in common to signal lines carrying the plurality of binary signals; and
  a summing node configured to combine the first and the second multi-level signals into an output multi-level signal.

2. The apparatus of claim 1, further comprising a second equalizer path including a second equalizer driver and a second capacitor.

3. The apparatus of claim 2, wherein the second equalizer path is selectively activated.

4. The apparatus of claim 1, wherein the primary driver circuit and the equalizer path are in parallel between an input node and the summing node.

5. The apparatus of claim 1, wherein the capacitor includes a fringe capacitor, a metal-oxide semiconductor capacitor (MOScap), a repurposed memory cell capacitor, or a metal-insulator-metal capacitor (MIMcap).

6. The apparatus of claim 1, wherein the primary driver circuit and the equalizer driver are pulse amplitude modulated (PAM) drivers, wherein the plurality of binary signals comprise a first binary signal and a second binary signal, and wherein the output multi-level signal has four levels.

7. The apparatus of claim 1, wherein the equalizer driver is smaller than the primary driver.

8. An apparatus comprising:
a primary driver circuit configured to receive a plurality of binary signals and provide a primary multi-level signal;
a plurality of selectable equalizer paths, each including an equalizer driver and a high pass filter, wherein selected ones of the plurality of equalizer paths are configured to receive the plurality of binary signals and provide a filtered multi-level signal, wherein the equalizer driver in each of the plurality of selectable equalizer paths and the primary driver circuit are coupled in common to signal lines which carry the plurality of binary signals; and
a summing node configured to provide an equalized output multi-level signal based on the primary multi-level signal and the filtered multi-level signals.

9. The apparatus of claim 8, wherein the selected ones of the plurality of equalizer paths are chosen based on a measurement of the output multi-level signal.

10. The apparatus of claim 8, wherein the primary driver and the equalizer driver are pulse amplitude modulated (PAM) drivers.

11. The apparatus of claim 10, wherein the output multi-level signal has four voltage levels.

12. The apparatus of claim 8, wherein the high-pass filter includes a capacitor.

13. The apparatus of claim 12, wherein the capacitor includes a fringe capacitor, a metal-oxide semiconductor capacitor (MOScap), a repurposed memory cell capacitor, or a metal-insulator-metal capacitor (MIMcap).

14. A system comprising:
a first device including a pre-emphasis driver configured to provide a multi-level signal based on the plurality of binary signals of the first device; and
a second device configured to receive the multi-level signal,
wherein the pre-emphasis driver comprises:
a primary driver circuit configured to receive a plurality of binary signals and provide a first multi level signal;
an equalizer path including an equalizer driver and a capacitor, wherein the equalizer path is configured to receive the plurality of binary signals and provide a second multi-level signal wherein the primary driver circuit and the equalizer driver are coupled in common to signal lines carrying the plurality of binary signals; and
a summing node configured to combine the first and the second multi-level signals into an output multi-level signal.

15. The system of claim 14, wherein the second device comprises a receiver and decoder configured to reconstruct the plurality of binary signals based on the multi-level signal.

16. The system of claim 14, wherein the pre-emphasis driver comprises a plurality of equalizer paths, each comprising an equalizer driver and capacitor.

17. The system of claim 16, wherein the first device includes an equalizer setting, and wherein a number of the equalizer paths are selectively activated based on the equalizer setting.

18. The system of claim 14, wherein the second-multi-level signal is high-pass filtered compared to the first multi-level.

19. The system of claim 14, wherein the second multi-level signal has a lower voltage than the first multi-level.

20. The system of claim 14, wherein the capacitor includes a metal-oxide semiconductor capacitor (MOScap).

* * * * *

UNITED STATES PATENT AND TRADEMARK OFFICE
CERTIFICATE OF CORRECTION

PATENT NO. : 11,450,380 B2
APPLICATION NO. : 16/940194
DATED : September 20, 2022
INVENTOR(S) : M. Ataul Karim and Timothy M. Hollis It is certified that error appears in the above-identified patent and that said Letters Patent is hereby corrected as shown below:

In the Claims

| Column | Line | Claim | Reads | Should Read |
|--------|------|-------|-------|-------------|
| 14 | 32 | 18 | "the first multi-level." | -- the first multi-level signal. -- |
| 14 | 34 | 19 | "the first multi-level." | -- the first multi-level signal. -- |

Signed and Sealed this
Fifteenth Day of November, 2022

Katherine Kelly Vidal
*Director of the United States Patent and Trademark Office*